(12) United States Patent
Lee

(10) Patent No.: US 6,529,557 B1
(45) Date of Patent: Mar. 4, 2003

(54) ADD-COMPARE SELECTION CIRCUIT

(75) Inventor: Sang-Bong Lee, Kyonggi-do (KR)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 09/271,126

(22) Filed: Mar. 17, 1999

(30) Foreign Application Priority Data

Mar. 17, 1998 (GB) .............................. 9805573

(51) Int. Cl.[7] .............................. H04L 32/02; H04L 5/12
(52) U.S. Cl. ...................... 375/262; 375/341; 714/795
(58) Field of Search ................. 375/341, 265, 375/262; 714/792, 794, 795, 796

(56) References Cited

U.S. PATENT DOCUMENTS 4,905,317 A * 2/1990 Suzuki et al. ............. 341/51
5,581,581 A * 12/1996 Sato ....................... 375/341
5,841,478 A * 11/1998 Hu et al. .................. 348/426
5,946,361 A * 8/1999 Araki et al. ............... 375/341

FOREIGN PATENT DOCUMENTS

EP          0677928 A1     10/1995

* cited by examiner

Primary Examiner—Phuong Phu
(74) Attorney, Agent, or Firm—Oliff & Berridge, PLC

(57) ABSTRACT

A high-speed add-compare selection apparatus, for a Viterbi algorithm processing apparatus having a branch metric calculator and a metric memory, is described. First and second previous metric values are supplied from the metric memory to first and second registers. The first previous metric value from the first register and a branch metric value of the present state calculated by the branch metric calculator are added, as are the second previous metric value from the second register and a branch metric value of the next state calculated by the branch metric calculator. The values obtained are compared and a survival metric value calculated accordingly.

14 Claims, 7 Drawing Sheets

ADD-COMPARE SELECTION CIRCUIT

BACKGROUND OF THE INVENTION

The present invention relates to an apparatus and method for processing a Viterbi algorithm, which may be used, for example, in a digital mobile communications system.

Viterbi decoders are used in digital wireless communication receivers to correct bit errors that occur in the wireless communication channel. With the Viterbi technique, an original data stream is encoded prior to transmission by adding bits thereto in a predetermined manner. The encoded bit stream is transmitted in a noisy channel which may produce bit errors due to multipath fading and the like. On the receive side, by decoding the received data stream using the Viterbi algorithm, the original data stream can be reproduced despite the occurrence of bit errors in the channel, provided that the number of bit errors is not excessive. Viterbi decoders operate by implementing a sequence determining method modeling a Gaussian channel.

Viterbi algorithms are widely used in mobile communications receivers owing to their excellent error correction rates. However, the Viterbi algorithm approach does involve substantial calculations and implementation time. In particular, the add-compare select (ACS) and trace-back portions of the computation require the most processing time. The ACS portion is used to determine the number of states in a convolutional encoder when a constraint length "K" is applied to the encoder. The trace-back portion uses simulation to determine a path length which plays an important role in determining the performance of the Viterbi algorithm.

In various mobile communication terminals which use time division multiple access (TDMA), such as in the Global Systems Mobile (GSM) system (a European digital mobile communications standard), since the time for processing received data is predetermined, the Viterbi algorithm must be as fast as possible. For example, since a TDMA cycle of the GSM system is limited to 4.615 ms, it is important to have a time margin for the purpose of achieving stable operation.

Recently, baseband systems have been implemented with digital signal processing (DSP). Since the Viterbi algorithm processing portion of the DSP requires numerous calculations and fast processing speed, a separate co-processing system is necessary. Although the Viterbi algorithm is determined in advance, there is still the possibility of improvements in design which increase speed and efficiency.

FIG. 1 is a block diagram of a conventional Viterbi decoder. A branch metric calculator (BMC) $1b$ receives a digital signal and calculates a branch metric value as probabilistic information. An add-compare selector (ACS) $2b$ uses the branch metric value from the BMC $1b$ to update a previous path metric corresponding to each state in a trellis. The ACS $2b$ compares the updated path metrics with each other and outputs a selected path metric and a determining bit. In a metric memory $3b$, the path metric selected by the ACS $2b$ is fed back to the ACS $2b$ in a subsequent step. A path memory $4b$ stores the determining bit output from the ACS $2b$. A trace-back controller $5b$ implements a trace-back operation using the determining bit stored in the path memory $4b$ and traces back the sequence of original information.

The conventional design of the ACS $2b$ will now be described. For the sake of explanation, an example of four states will be used. It is necessary to trace the most likely metric in the Viterbi algorithm for searching proper data. The following formula is used for calculating a survival metric in the Viterbi algorithm:

$$M_n,s0 = \max(M_{n-1}^{p0} + bmc1^{p0}{}_{s0}, M_{n-1}^{p1} + bmc2^{p1}{}_{s0})$$
$$M_n,s1 = \max(M_{n-1}^{p2} + bmc1^{p2}{}_{s1}, M_{n-1}^{p3} + bmc2^{p3}{}_{s1})$$
$$M_n,s2 = \max(M_{n-1}^{p0} + bmc1^{p0}{}_{s2}, M_{n-1}^{p1} + bmc2^{p1}{}_{s2})$$
$$M_n,s3 = \max(M_{n-1}^{p2} + bmc1^{p2}{}_{s3}, M_{n-1}^{p3} + bmc2^{p3}{}_{s3}) \quad (1)$$

where M implies the survival metric of two metric values.

The BMC $1b$ generates the same metric value as that of the convolutional encoder and obtains the difference from received data, to generate branch metrics such as $bmc1^{p0}{}_{s0}$ and $bmc2^{p1}{}_{s0}$. Thus, the survival metric of the present state is the larger value of two values, i.e., the first value being the sum of a first previous metric value and a first branch metric (of the present state) and the second value being the sum of a second previous metric value and a second branch metric (of the next state). To this end, at least two adders and a comparator are necessary.

To calculate the survival metric of the present state, the previous metric value stored in the metric memory $3b$ is read and compared with a value obtained by adding the read metric value and the present metric value. Then the most similar value to the transmitted value is searched.

FIG. 2 illustrates metric values of the respective states and calculated branch metric values for calculating the survival metric of the Viterbi algorithm. As shown, to calculate the metric value of a state 00, the previous metric value $M_{n-1}^{p0}$ is read. Then, a value obtained by adding the same to $bmc1^{p0}{}_{s0}$ is compared with a value obtained by adding $M_{n-1}^{p1}$ to $bmc2^{p1}{}_{s0}$. Of the two values, the larger value is determined as the survival metric ($M_n,s0$) of the state 00. Thus, to obtain one survival metric value, two cycles are required in each state just for reading the previous metric values. In other words, to calculate the survival metric value, the previous metric values 0 and 1 must be read in the state 00, and the previous metric values 2 and 3 must be read in the state 01. To calculate the survival metric values in the case of four states (e.g., states 00, 01, 10 and 10 in FIG. 2), eight cycles are required just for reading the previous metric values.

Thus, with the above approach, the metric memory must be frequently accessed, resulting in excessive operations and power consumption. Also, since many clock cycles are required to compute survival metrics, this method is not suitable for a high speed Viterbi algorithm implementation, such as in a GSM communication system.

A Viterbi algorithm processing apparatus as that discussed above is useful for both a Viterbi equalizer and a Viterbi decoder. The term "equalizer" is a generic term for a signal processing device that can demodulate or decode a signal while compensating for certain imperfections in the radio link. The Viterbi equalizer effectuates this by using a model of the channel or propagation paths which is applied to hypothesized symbol sequences to predict what should be received. The hypothesis that most closely matches the actual received signal is then retained.

FIG. 3A is a block diagram of a Viterbi algorithm processing apparatus 25 included in a Viterbi equalizer. The structure is similar to the decoder of FIG. 1, except the BMC $1b$ is replaced by a Euclidean Distance Calculator (EDC) $1a$. FIG. 3B is a block diagram of a Viterbi equalizer including the Viterbi algorithm processing apparatus.

Referring to FIG. 3B, an impulse response estimator 20 receives input data and measures a channel impulse response of the received data. A filter 10 is implemented by a finite impulse response (FIR) filter designed to have the maximum signal-to-noise ratio at the output terminal at a particular time. The filter 10 is a matched filter which multiplies a reversal of the channel impulse response input from the impulse response estimator 20 by the received data and then time-shifts the multiplied value. Viterbi algorithm processing apparatus 25 receives the data output from the filter 10 and the channel impulse response from the impulse response estimator 10 and performs the Viterbi algorithm for equalization. A demodulator 40 MSK demodulates data output from the Viterbi algorithm processing apparatus 25. A reliability calculator 50 calculates the reliability of the data processed in the Viterbi algorithm processing apparatus 25.

Such a Viterbi equalizer can be implemented by a digital signal processor (DSP) or by hardware (e.g., an equalizer processor or a VLSI). However, when realized by a DSP, the Euclidean distance calculations of the Viterbi algorithm are more complicated, and there are more bit operations at the ACS and trace-back portions, resulting in a complex processing task which increase the power consumption. In addition, to satisfy the system timing, some DSP makers provide coprocessors. When realized by hardware, multipliers, dividers and adders are required according to the characteristics of the filter or the Viterbi algorithm, raising a complexity problem. Also, if the Viterbi equalizer is implemented by an ASIC (Application Specific Integrated Circuit) a chip size problem may arise.

SUMMARY OF THE INVENTION

An object of the present invention is to provide an apparatus and method for processing a Viterbi algorithm, which increases the processing speed of the computationally complex ACS portion, thereby reducing power consumption.

Another object of the present invention is to provide a small high-speed Viterbi algorithm processing apparatus by divisionally designing the Viterbi algorithm into a portion to be processed by a digital signal processor and another portion to be processed by hardware according to the contents of the algorithm so as to increase the efficiency.

In one aspect of the invention, a high-speed add-compare selection circuit for a Viterbi algorithm processing apparatus having a branch metric calculator and a metric memory includes: first and second registers for temporarily storing first and second previous metric values read from the memory; a first adder for adding the first previous metric value from the first register and a branch metric value of the present state calculated by the branch metric calculator; a second adder for adding the second previous metric value from the second register and a branch metric value of the next state calculated by the branch metric calculator; and a comparator for comparing the outputs of the first and second adders and calculating a survival metric value accordingly.

The high-speed add-compare selection circuit may also be used as part of a Viterbi equalizer having a Euclidian value calculator. In this case, the first and second adders add metric values from the registers with Euclidian values from the Euclidian value calculator in place of the branch metric values from the branch metric calculator.

Advantageously, the add-compare selection circuit allows for faster Viterbi processing time as compared to the conventional art. The improvement in processing time stems from the reduction in the number of metric memory accesses required to read metric value data, and the attendant reduction in the number of clock cycles needed to compute survival metrics.

BRIEF DESCRIPTION OF THE DRAWINGS

Preferred embodiments of the present invention will now be described with reference to the accompanying drawings in which.

DETAILED DESCRIPTION OF THE PREFERRED EMBODIMENT

Figure 3A:
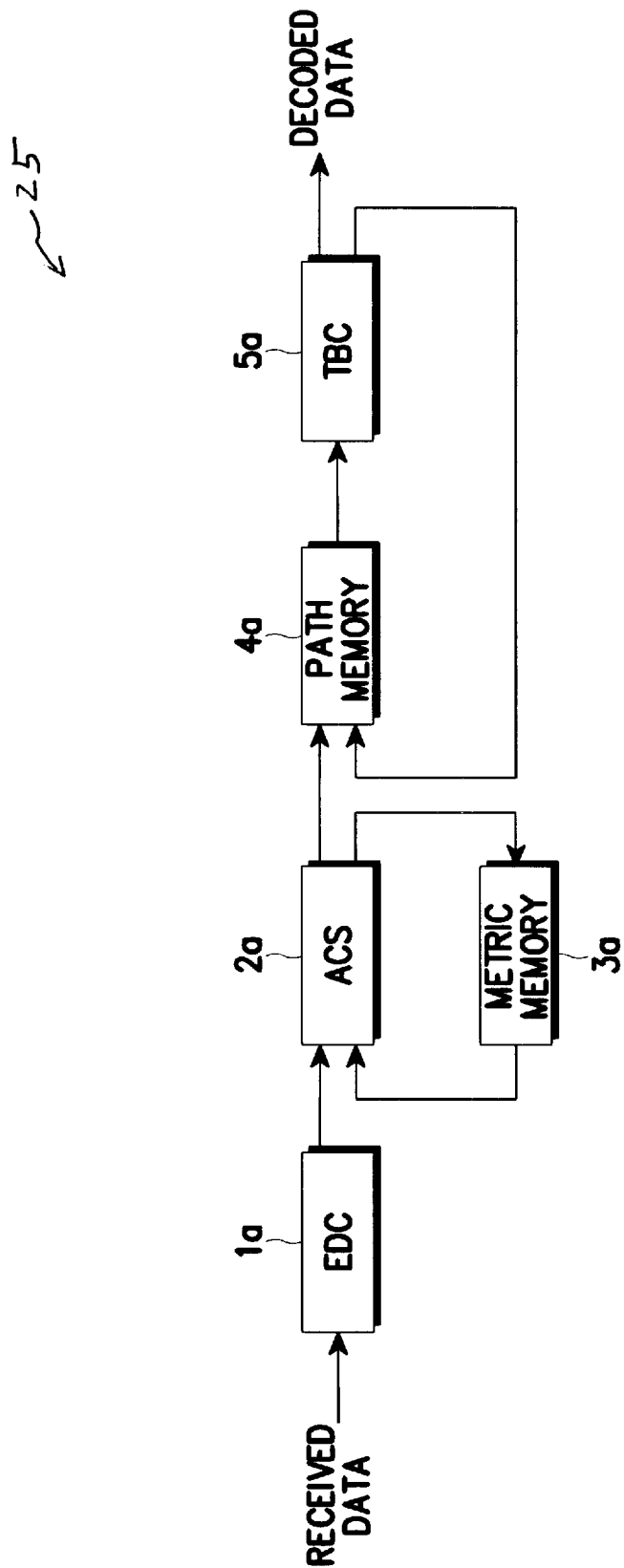
FIG. 3A is a block diagram of a Viterbi algorithm processing apparatus included in a Viterbi equalizer.
Figure 4:
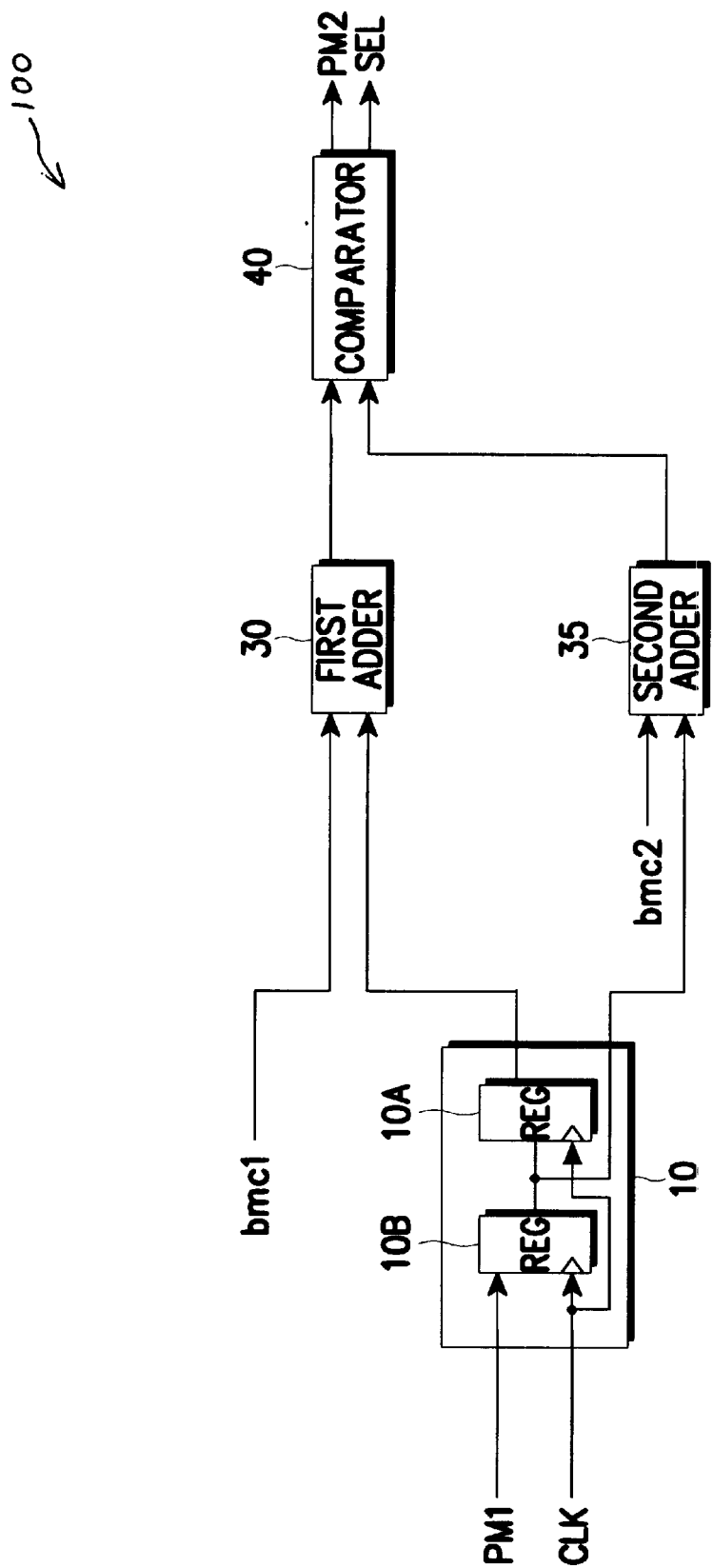
FIG. 4 is a schematic diagram of an add-compare selector of a Viterbi decoder according to a preferred embodiment of the present invention.

Referring to FIG. 4, a block diagram of an add-compare selector, 100, in accordance with the invention is illustrated. Add-compare selector 100 may be used in place of the ACS 2 of FIG. 1 to provide a Viterbi decoder in accordance with the invention. The Viterbi decoder typically forms part of a mobile communications terminal, but may be used in other applications as well. Add-compare selector 100 can also be used in place of ACS 2a of FIG. 3A to realize a Viterbi algorithm processing apparatus for a Viterbi equalizer in accordance with the invention; however, in this case, the inputs bmc1 and bmc2 would be replaced with edc1 and edc2, respectively.

Figure 1:
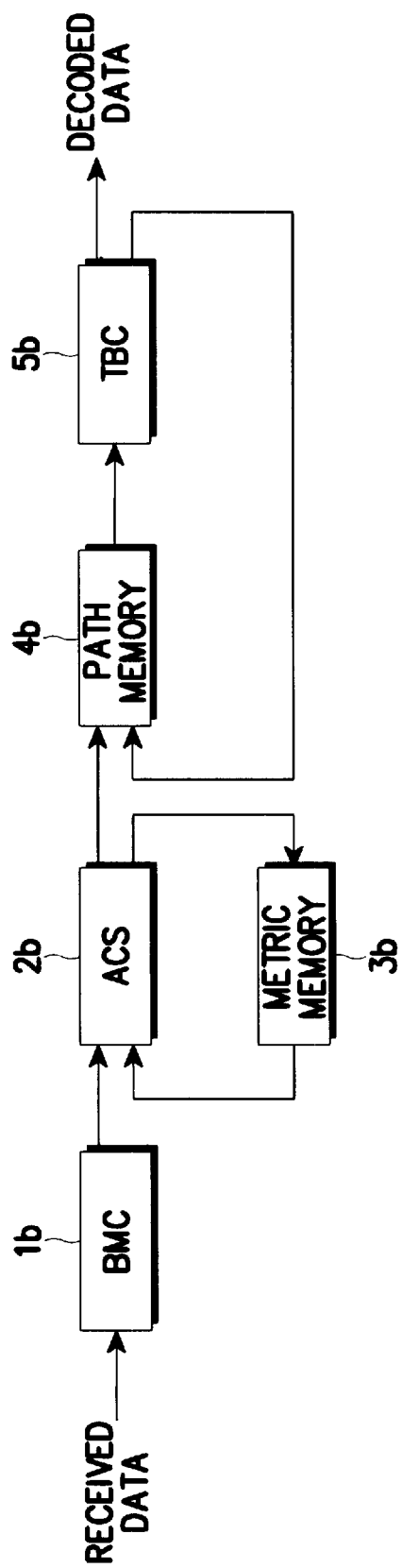
FIG. 1 is a block diagram of a conventional Viterbi decoder.

Add-compare selector 100 includes a register portion 10 comprising a register 10B (second register) for storing a predetermined previous metric value read from the metric memory 3b of FIG. 1 and another register 10A (first register) for storing the previous metric value shifted and read from the second register 10B. A first adder 30 reads the first previous metric value which is shifted out of the first register 10A, and adds this value to a calculated branch metric value bmc1 of the present state, output from the BMC shown in FIG. 1. Since registers 10A and 10B are enabled by the same clock, at the time in which register 10A shifts the first previous metric value to its output ports, register 10B shifts a second previous metric value to its own output ports. This second previous metric value shifted by register 10B is read by a second adder 35, which adds it to a calculated branch metric value bmc2 of the next state, also output from the BMC. A comparator 40 compares the outputs of the first and second adders 30 and 35 to determine the larger value as the survival metric, i.e., the present metric value PM2.

The first and second branch metric values bmc1 and bmc2 may be Euclidian distances (i.e., edc1 and edc2 mentioned earlier) in a Viterbi equalizer or Hamming distances in a convolutional decoder. The BMC 1b shown in FIG. 1, used in the presently described embodiment, obtains the difference between received data and predetermined transmitted data, which is the first and second branch metric values bmc1 and bmc2.

The previous metric value PM1 is read from metric memory 3b. The number of states read, as well as the length of each state, are determined in accordance with the application. In addition, the size of the first and second registers 10A and 10B and the first and second adders 30 and 35 are determined accordingly.

As expressed in the above formula (1), ACS 100 determines the survival metric of state 00 by register 10B first reading the previous metric value $M_{n-1}^{P0}$. This value is transferred to register 10A while a second previous metric value $M_{n-1}^{P1}$ is read by register 10B. Comparator 40 then compares the sum $(M_{n-1}^{P0}+bmc1^{P0}{}_{s0})$ computed by first adder 30 with the sum $(M_{n-1}^{P1}+bmc2^{P1}{}_{s0})$ computed by second adder 35. Of the two values, the larger value is determined as the survival metric $M_n,s0$ of the present state 00. The information indicating which of the two survives, i.e., a determining bit, is generated by the comparator 40. The determining bit (SEL) is stored in the path memory 4 and is to be used later in tracing back data.

The gist of the present invention is essentially that the data is read from a previous metric memory and stored in the register portion 10 to be used in calculating the next state, without the need to access the same memory repeatedly.

Figure 2:
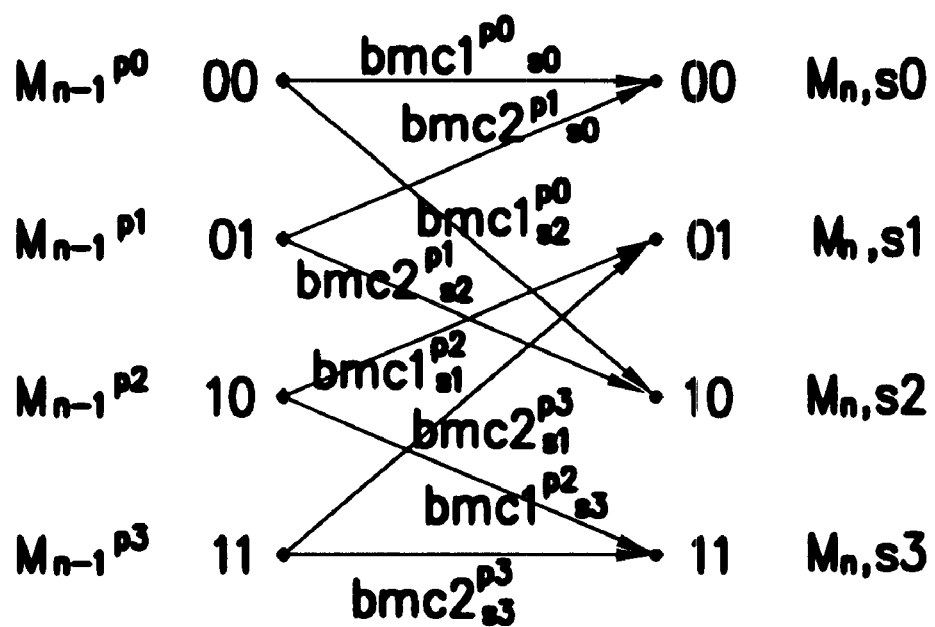
FIG. 2 illustrates metric values of each state and calculated branch metric values for calculating the survival metric of a Viterbi algorithm.

Referring to FIG. 2 in conjunction with FIG. 4, with ACS 100, the metric values of the previous states 00 and 01 are read in the present states 00 and 10. Therefore, the sequence of calculating the present metric states is from 00 to 10 to 01 to 11, unlike the conventional sequence from 00 to 01 to 10 to 11. In other words, with the present embodiment, the sequence of reading the previous metric values from registers 10A and 10B is from the state 00 to 01 to 00 to 01 to 10 to 11 to 10 to 11. Thus, the metric values corresponding to the previous states 00 and 01 read from the metric memory 3b are latched to the first and second registers 10A and 10B, respectively, and then the ACS values of the present states 00 and 10 are sequentially calculated. Thus, after calculating the present state 00, the metric values corresponding to the previous states 00 and 01 are read from the first and second registers 10A and 10B, thereby calculating the ACS output value of the present state 10, without the need to read the metric memory 3b again.

The metric values of the previous states 10 and 11 are latched from metric memory 3b and then stored in the first and second registers 10A and 10B. Then, the present states 01 and 11 are sequentially calculated in a similar manner to that described above. Consequently, the number of times the previous metric values are read from metric memory 3b is reduced from eight times to four times.

Figure 5:
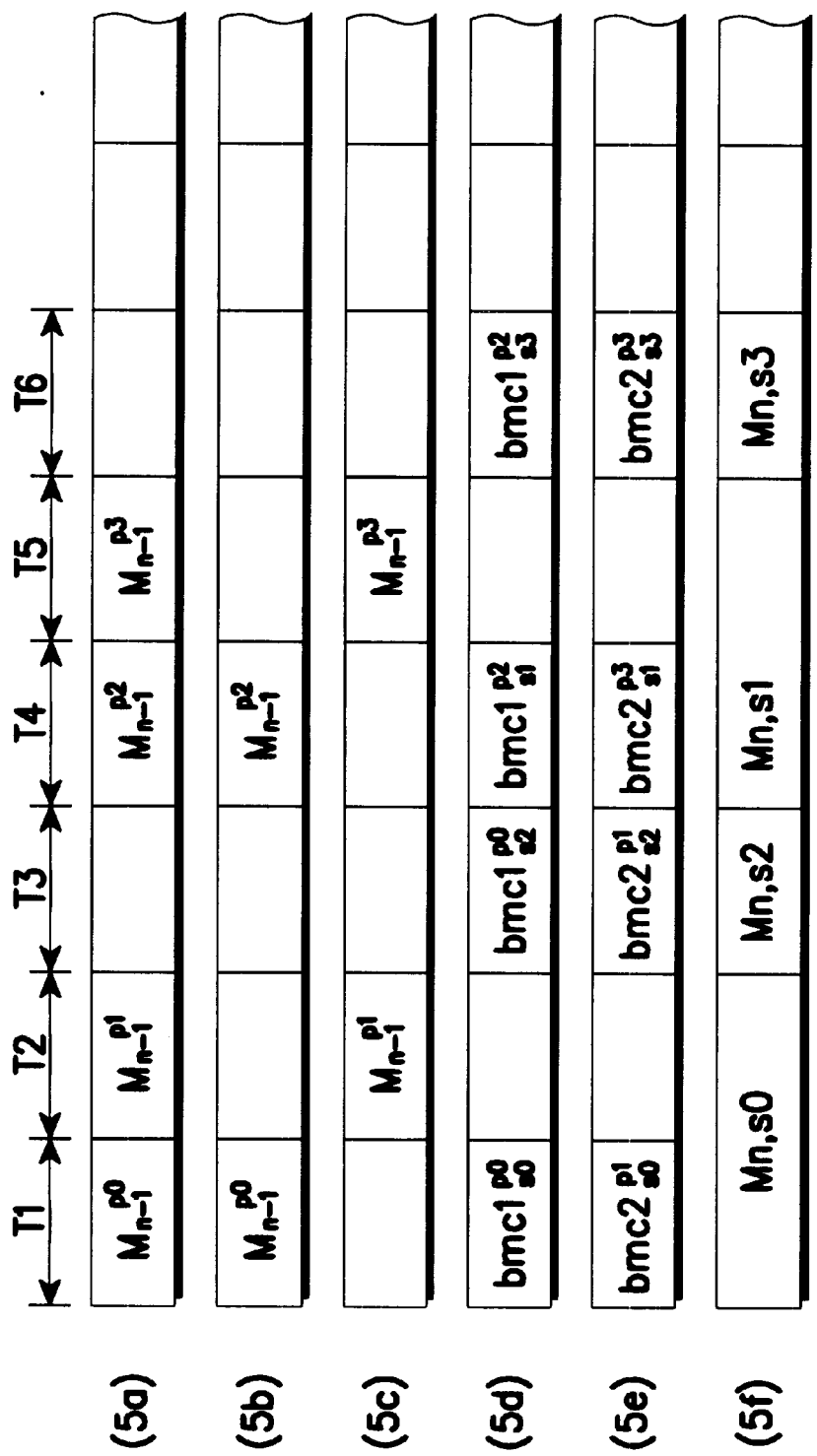
FIG. 5 is an operational timing diagram according to a preferred embodiment of the present invention.

FIG. 5 is an operational timing diagram according to a preferred embodiment of the present invention, consisting of diagrams (5a) to (5f). The time frames T1 to T6 correspond to unit clocks. Diagram (5a) illustrates the sequence of reading previous metric values from the metric memory 3b; diagram (5b) illustrates the value of the second register 10B in the various time frames T1 to T6; diagram (5c) illustrates the value of the first register 10A at various times; diagram (5d) illustrates the value of bmc1; diagram (5e) illustrates the value of bmc2; and diagram (5f) illustrates the present metric value stored in the path memory 4b.

In time frames T1 and T2 of diagram (5a), the metric values $M_{n-1}^{P0}$ and $M_{n-1}^{P1}$ for the previous states 00 and 01 are sequentially read from the metric memory 3b. In period T1 of diagram (5b) and period T2 of diagram (5c), the values read are stored in the first and second registers 10A and 10B, respectively. In time frames T1 and T2 of diagrams (5d) and (5e), using the values $bmc1^{P0}{}_{s0}$ and $bmc2^{P1}{}_{s0}$, calculated by the BMC 1, the ACS values are calculated based on the above formula (1). The resulting present metric value of the present state 00 is $M_n,s0$, as shown in time frames T1 and T2 of diagram (5f).

Next, the metric values $M_{n-1}^{P0}$ and $M_{n-1}^{P1}$ for the previous states 00 and 01, stored in the first and second registers 10A and 10B, and the values $bmc1^{P0}{}_{s2}$ and $bmc2^{P1}{}_{s2}$, calculated by the BMC 1b and shown by block T3 in diagrams (5d) and (5e), are used to calculate the ACS values based on the above formula (1). The resulting present metric value of the present state 10 is $M_n,s2$, as shown in frame T3 of (5f).

As shown in frames T4 and T5 of diagram (5a), the metric values $M_{n-1}^{P2}$ and $M_{n-1}^{P3}$ for the previous states 10 and 11 are sequentially read from metric memory 3b. Then, as seen in frame T4 of (5b) and block T5 in (5c), the values read are stored in the first and second registers 10A and 10B respectively. As shown by block T4 in diagrams (5d) and (5e), using the values $bmc1^{P0}{}_{s0}$ and $bmc2^{P1}{}_{s0}$, calculated by the BMC 1, the ACS values are calculated based on the above formula (1). The resulting present metric value of the present state 01 is $M_n,s1$, as seen in frames T4 and T5 in diagram (5f).

Next, the metric values $M_{n-1}^{P2}$ and $M_{n-1}^{P3}$ for the previous states 10 and 11, stored in the first and second registers 10A and 10B, and the values $bmc1^{P2}{}_{s3}$ and $bmc2^{P3}{}_{s3}$, calculated by the BMC 1 and shown in frame T6 of diagrams (5d) and (5e), the ACS values are calculated based on the above formula (1). The resulting present metric value of the present state 11 is $M_n,s3$, as shown in frame T6 of diagram (5f).

In conclusion, as described above, the sequence of calculating the present metric values, i.e., 00 to 10 to 01 to 11, is different from that of the conventional art. Thus, when obtaining the metric values of the present states 10 and 11, it is not necessary to access the memory again to read the previous metric values. Instead, the previous metric values read for obtaining the metric values of the present states 00 and 01 are used, thus saving time.

In other words, in the case of four states, the number of times the metric memory 3b is read is conventionally eight times, but only four times with the present invention. In addition, the number of overall required clock cycles is reduced by two clock cycles. That is, eight clock cycles are required conventionally, but only six clock cycles are required with the embodiment disclosed herein. (The time frames T1 through T6 of FIG. 5 correspond to unit clocks.)

Figure 6:
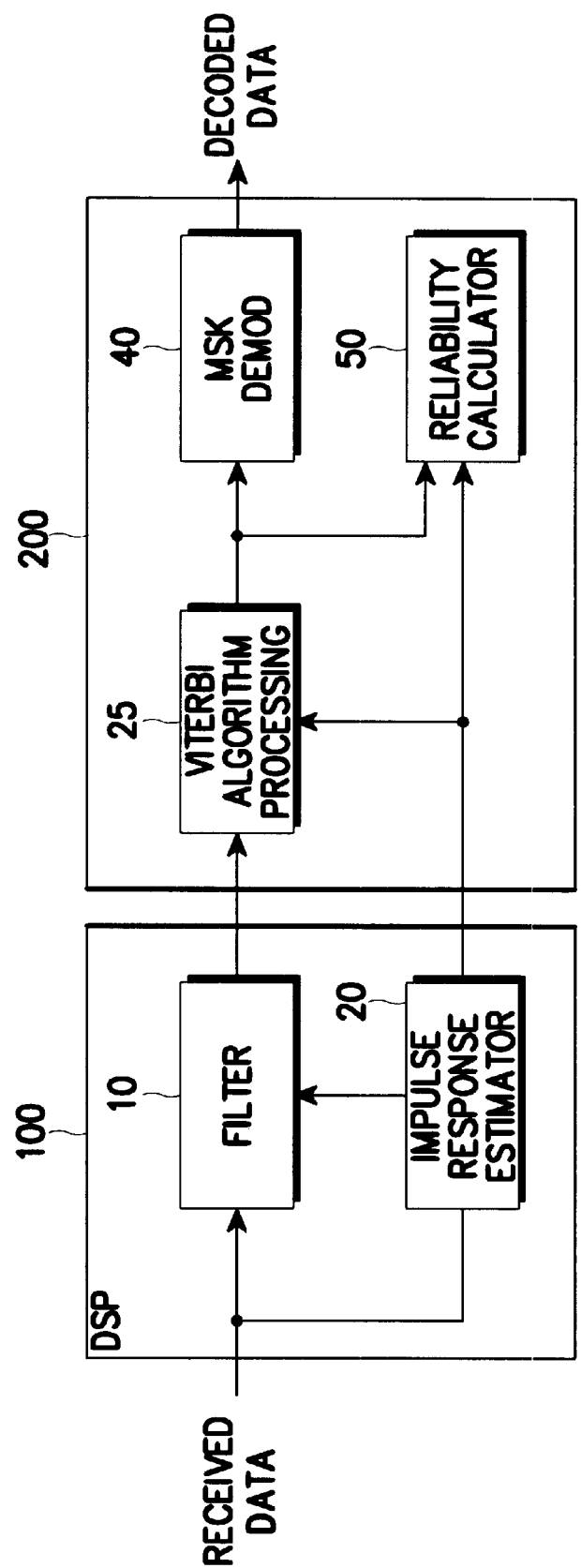
FIG. 6 is a block diagram of a Viterbi equalizer according to an embodiment of the present invention.

FIG. 6 illustrates an exemplary Viterbi equalizer according to an embodiment of the present invention. The filter 10 and the impulse response estimator 20 represented by block 100 form a preprocessing portion which is implemented by a DSP. The portion represented by reference numeral 200 is a pure Viterbi algorithm processing portion and is implemented by hardware. As such, the configuration differs from that shown in FIG. 3B, where the entire Viterbi equalizer is implemented with a DSP.

Figure 3B:
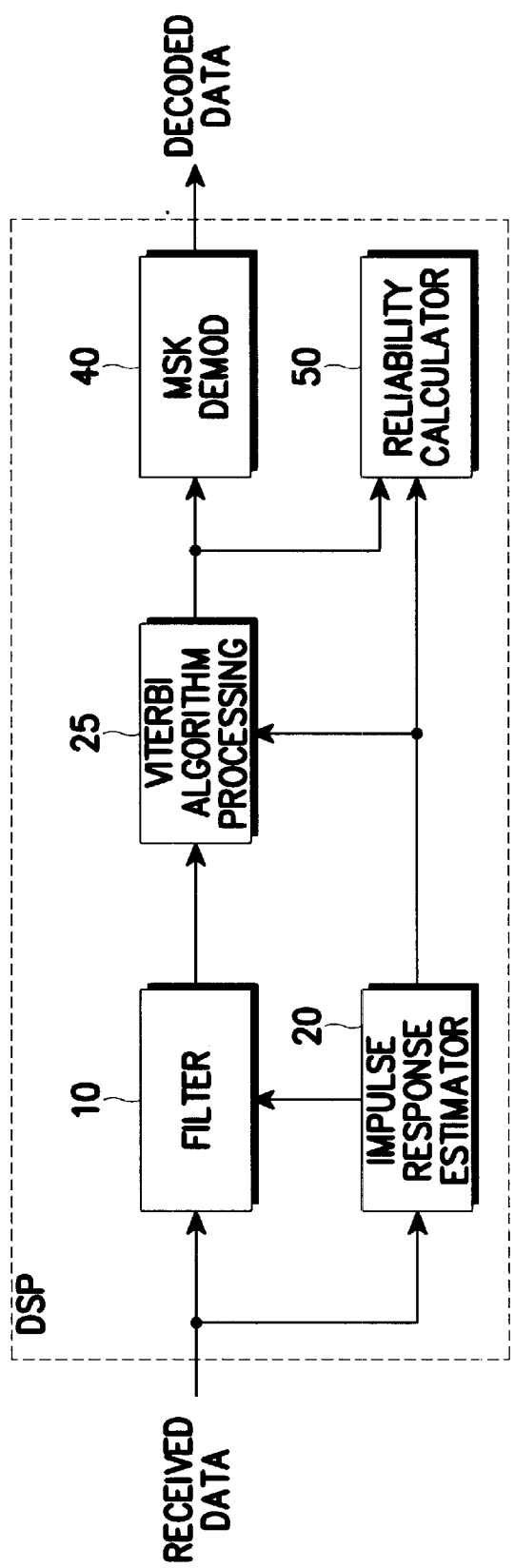
FIG. 3B is a block diagram of a Viterbi equalizer including the Viterbi algorithm processing apparatus of FIG. 3A.

In FIG. 6, the Viterbi algorithm processing apparatus 25' has the same basic structure as that shown in FIG. 3A, except that apparatus 25' includes ACS 100 of FIG. 4 in place of the conventional ACS 2a. A Euclidian Distance Calculator (EDC) 1a in FIG. 3A (also referred to as a Euclidean Value Calculator) implements the following known calculations:

$$edc1^{P0}{}_{sk(k=0,2)}=|r_n-r^{P0}{}_{sk}|^2=[R(r_n)-R(r^{P0}{}_{sk})]^2+[I(r_n)-I(r^{P0}{}_{sk})]^2$$

$$edc1^{P2}{}_{sk(k=1,3)}=|r_n-r^{P2}{}_{sk}|^2=[R(r_n)-R(r^{P2}{}_{sk})]^2+[I(r_n)-I(r^{P2}{}_{sk})]^2$$

$$edc2^{P1}{}_{sk(k=0,2)}=|r_n-r^{P1}{}_{sk}|^2=[R(r_n)-R(r^{P1}{}_{sk})]^2+[I(r_n)-I(r^{P1}{}_{sk})]^2$$

$$edc2^{P3}{}_{sk(k=1,3)}=|r_n-r^{P3}{}_{sk}|^2=[R(r_n)-R(r^{P3}{}_{sk})]^2+[I(r_n)-I(r^{P3}{}_{sk})]^2$$

where R is a real number, I is an imaginary number, $r_n$ is received data, and $r_n^{P1}$ and $r_n^{P2}$ are reference data.

To perform the Euclidian calculation, the EDC 1a requires subtracters, multipliers and adders. After Euclidian calculation, the ACS 100 performs the known add-compare calculation given by:

$$M_n,s0=\min(M_{n-1}{}^{p0}+edc1^{p0}{}_{s0}, M_{n-1}{}^{p1}+edc2^{p1}{}_{s0})$$

$$M_n,s1=\min(M_{n-1}{}^{p2}+edc1^{p2}{}_{s1}, M_{n-1}{}^{p3}+edc2^{p1}{}_{s1})$$

$$M_n,s2=\min(M_{n-1}{}^{p0}+edc1^{p0}{}_{s2}, M_{n-1}{}^{p1}+edc2^{p1}{}_{s2})$$

$$M_n,s3=\min(M_{n-1}{}^{p2}+edc1^{p2}{}_{s3}, M_{n-1}{}^{p3}+edc2^{p1}{}_{s3})$$

Hence, the Viterbi preprocessing portion 100 is operative to estimate a channel impulse response from received data, multiply a reversal of the estimated channel impulse response by the received data, and time shift the multiplied result. Apparatus 25 performs a Viterbi algorithm for equalization of the time-shifted data and the estimated channel impulse response provided from the Viterbi preprocessing portion 100.

For the add-compare calculation, the ACS 2a requires adders and comparators. Like the Euclidian calculation, the add-compare calculation also requires calculations (additions) twice in the respective states. Therefore, it is possible to increase the data processing speed by implementing this portion with hardware to operate in parallel. In other words, the conventional apparatus implemented by the DSP performs the calculations in sequence, which takes more time as compared to when the calculations are performed in parallel. In the embodiment, the portion for processing the pure Viterbi algorithm is implemented by hardware, so that about ⅕ of the cycle time is required relative to the case where it is implemented by the DSP, thereby reducing the power consumption and improving the time margin in implementing the system.

More specifically, the preferred hardware to perform the add-compare calculations, in accordance with the invention, is the same as that shown in FIG. 4, except that instead of branch metric values being applied to the first and second adders 30 and 35, Euclidian values from the Euclidian value calculator are applied thereto. Otherwise, the operation of ACS 100 for the Viterbi equalizer is the same as that described above for the Viterbi decoder.

From the foregoing, thus described is an improved add-compare selector which exhibits faster Viterbi processing time as compared to the conventional art. When using an ACS circuit as in the above-described embodiment of the present invention, overall Viterbi processing time can be reduced dramatically, e.g. by 25%. The improvement in processing time stems from the reduction in the number of memory accesses required to read metric value data, whereby total memory access time is reduced. The improvement in Viterbi processing speed renders it easier to attain a specific timing margin in implementing the system, thereby improving reliability. Moreover, the reduction in the number of memory access operations results in an attendant reduction in power consumption.

Furthermore, by divisionally implementing both the Viterbi equalizer and the Viterbi decoder into a portion to be processed by a DSP and a portion to be processed by hardware, it is possible to consider the particulars pertinent to the size of the mobile communication terminal at the design stage. In addition, the portion implemented by hardware has a parallel data processing path, increasing the data processing speed.

While the present invention has been described in reference to an exemplary embodiment thereof, it will be understood to those skilled in the art that various changes in form and details may be made thereto without departing from the spirit and scope of the invention as defined by the appended claims.

What is claimed is:

1. A high-speed add-compare selection apparatus, for use in a Viterbi algorithm processing apparatus having a branch metric calculator and a metric memory, comprising:

first and second registers;

means for supplying to the first and second registers first and second previous metric values, respectively, from the metric memory;

a first adder for adding the first previous metric value from the first register and a branch metric value of a first present state calculated by the branch metric calculator, and adding the first previous metric value from the first register and a branch metric value of a second present state calculated by the branch metric calculator;

a second adder for adding the second previous metric value from the second register and a branch metric value of a first next state calculated by the branch metric calculator, and adding the second previous metric value from the second register and a branch metric value of a second next state calculated by the branch metric calculator; and a comparator for comparing the outputs of the first and second adders and calculating a first survival metric value and a second survival metric value accordingly.

2. The high-speed add-compare selection apparatus of claim 1 wherein the means for supplying the first and second previous metric values to the first and second registers comprises means for supplying to the first register a first previous metric value from the second register and for supplying to the second register a second previous metric value from the metric memory.

3. The high-speed add-compare selection apparatus of claim 1 wherein the first and second metric values are Hamming distances.

4. The high-speed add-compare selection apparatus of claim 2 wherein the first and second metric values are Hamming distances.

5. The high-speed add-compare selection apparatus of claim 1 wherein the first and second metric values are Euclidian distances.

6. The high-speed add-compare selection apparatus of claim 2 wherein the first and second metric values are Euclidian distances.

7. A wireless communications terminal, comprising:

a Viterbi decoder having a branch metric calculator, a metric memory, and an add-compare selection apparatus, said add-compare selection apparatus comprising:

first and second registers for temporarily storing first and second previous metric values, respectively, read from said metric memory;

a first adder for adding the first previous metric value from the first register and a branch metric value of a first present state calculated by the branch metric calculator, and adding the first previous metric value from the first register and a branch metric value of a second present state calculated by the branch metric calculator;

a second adder for adding the second previous metric value from the second register and a branch metric value of a first next state calculated by the branch metric calculator, and adding the second previous metric value from the second register and a branch metric value of a second next state calculated by the branch metric calculator; and a comparator for comparing the outputs of the first and second adders and calculating a first survival metric value and a second survival metric value accordingly.

8. The wireless communications terminal of claim 7 wherein said first and second registers are connected in series and clocked synchronously, with said second register reading previous metric data directly from said metric memory and transferring said previous metric data to said first register, said second adder is coupled to an output of said second register and said first adder is coupled to an output of said first register.

9. The wireless communications terminal of claim 7 wherein the first and second metric values are Hamming distances.

10. The wireless communications terminal of claim 8 wherein the first and second metric values are Hamming distances.

11. The wireless communications terminal of claim 7 wherein the first and second metric values are Euclidian distances.

12. The wireless communications terminal of claim 8 wherein the first and second metric values are Euclidian distances.

13. A high-speed add-compare selection apparatus for a Viterbi algorithm processing apparatus having a Euclidian value calculator and a metric memory, comprising:

first and second registers for shiftingly storing first and second previous metric values read in sequence from the metric memory;

a first adder for adding the first previous metric value input from the first register to a Euclidian value of a first present state calculated by the Euclidian value calculator or adding the first previous metric value input from the first register to a Euclidian value of a first next state calculated by the Euclidian value calculator, and adding the first previous metric value input from the first register to a Euclidian value of a second present state calculated by the Euclidian value calculator or adding the first previous metric value input from the first register to a Euclidian value of a second next state calculated by the Euclidian value calculator;

a second adder for adding the second previous metric value input from the second register to a Euclidian value of the first present state calculated by the Euclidian value calculator or adding the second previous metric value input from the second register to the Euclidian value of the first next state calculated by the Euclidian value calculator, and adding the second previous metric value input from the second register to a Euclidian value of the second present state calculated by the Euclidian value calculator or adding the second previous metric value input from the second register to the Euclidian value of the second next state calculated by the Euclidian value calculator; and a comparator for comparing outputs of the first and second adders to calculate a first survival metric and a second survival metric accordingly.

14. A Viterbi algorithm processing method for use in an add-compare selector having first and second registers, a Euclidian value calculator and a metric memory, comprising the steps of:

a) reading n-th and (n+1)-st previous metric values from the metric memory and storing the read values in the first and second registers, where n is a positive integer;

b) comparing a first value obtained by adding the n-th previous metric value stored in the first register and a Euclidian value of the present state calculated by the Euclidian value calculator, with a second value obtained by adding the (n+1)-st previous metric value stored in the second register and a Euclidian value of a next state calculated by the Euclidian value calculator, so as to determine a higher value of said first and second values as an n-th survival metric;

c) comparing a third value obtained by adding the n-th previous metric value stored in the second register and another Euclidian value of the present state calculated by the Euclidian value calculator, with a fourth value obtained by adding the (n+1)-st previous metric value stored in the second register and another Euclidian value of the next state calculated by the Euclidian value calculator so as to determine a higher value of said third and fourth values as an (n+1)-st survival metric; and d) increasing n by one and returning to said step (a) to perform Viterbi algorithm processing for another present state.

* * * * *

UNITED STATES PATENT AND TRADEMARK OFFICE
CERTIFICATE OF CORRECTION

PATENT NO. : 6,529,557 B1
DATED : March 4, 2003
INVENTOR(S) : Sang-Bong Lee

It is certified that error appears in the above-identified patent and that said Letters Patent is hereby corrected as shown below:

<u>Title page,</u>
Item [73], "Brother Kogyo Kabushiki Kaisha (Nagoya, JP)" should be
-- Samsung Electronics Co., Ltd. (KR) --.
Item [30], "9805573" should be -- 98055734 --.
Item [74], "Oliff & Berridge, PLC" should be -- Dilworth & Barrese, LLP --.

Signed and Sealed this

Eighteenth Day of November, 2003

JAMES E. ROGAN
*Director of the United States Patent and Trademark Office*